(12) United States Patent
Takegami et al.

(10) Patent No.: US 11,307,261 B2
(45) Date of Patent: Apr. 19, 2022

(54) RECHARGEABLE BATTERY STATE ESTIMATION DEVICE

(71) Applicant: Mitsubishi Electric Corporation, Tokyo (JP)

(72) Inventors: Tomoki Takegami, Tokyo (JP); Toshihiro Wada, Tokyo (JP); Seigo Kadota, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 53 days.

(21) Appl. No.: 16/491,194

(22) PCT Filed: Nov. 6, 2017

(86) PCT No.: PCT/JP2017/039929
§ 371 (c)(1),
(2) Date: Sep. 5, 2019

(87) PCT Pub. No.: WO2018/179562
PCT Pub. Date: Oct. 4, 2018

(65) Prior Publication Data
US 2020/0033416 A1    Jan. 30, 2020

(30) Foreign Application Priority Data

Mar. 31, 2017  (JP) .............................. JP2017-069940

(51) Int. Cl.
*G01R 31/3828* (2019.01)
*G01R 31/3842* (2019.01)
(Continued)

(52) U.S. Cl.
CPC ....... *G01R 31/3828* (2019.01); *G01R 31/367* (2019.01); *G01R 31/3842* (2019.01); *H01M 10/48* (2013.01)

(58) Field of Classification Search
CPC ............ G01R 31/3828; G01R 31/3842; G01R 31/367; G01R 31/3648; G01R 31/36;
(Continued)

(56) References Cited

U.S. PATENT DOCUMENTS 9,784,794 B2 * 10/2017 Itabashi ............... G01R 31/389
2013/0158916 A1 * 6/2013 Baruzzi ................ G01R 31/367
702/63
(Continued)

FOREIGN PATENT DOCUMENTS

| JP | 5419832 B2 | 2/2014 |
| JP | 2014174050 A | 9/2014 |

(Continued)

OTHER PUBLICATIONS

International Search Report (PCT/ISA/210) dated Feb. 6, 2018, by the Japan Patent Office as the International Searching Authority for International Application No. PCT/JP2017/039929.

(Continued)

*Primary Examiner* — Akm Zakaria
(74) *Attorney, Agent, or Firm* — Buchanan Ingersoll & Rooney PC

(57) ABSTRACT

In response to demands for stably and precisely estimating states, a rechargeable battery state estimation device includes a current detecting unit which detects a charge-discharge current of the rechargeable battery as a detected current; a voltage detecting unit which detects a voltage between terminals of the rechargeable battery as a detected voltage; an OCV estimation method SOC estimation unit which calculates an OCV estimation method state of charge, based on the detected current and the detected voltage; a current integration method parameter estimation unit which estimates a current integration method parameter including a capacity retention rate, based on the detected current and
(Continued)

the OCV estimation method state of charge; and a corrected SOC estimation unit which calculates an estimated state of charge, based on the detected current, the OCV estimation method state of charge, and the current integration method parameter.

17 Claims, 13 Drawing Sheets

(51) Int. Cl.
*G01R 31/367* (2019.01)
*H01M 10/48* (2006.01)

(58) Field of Classification Search
CPC .... G01R 31/374; H01M 10/48; H01M 10/42; Y02E 60/10; H02J 7/00
See application file for complete search history.

(56) References Cited

U.S. PATENT DOCUMENTS

| | | | |
|---|---|---|---|
| 2015/0293183 A1* | 10/2015 | Tenmyo | G01R 31/367 324/429 |
| 2016/0131720 A1* | 5/2016 | Baba | G01R 35/005 702/63 |
| 2016/0252585 A1* | 9/2016 | Baba | H01M 10/48 702/63 |
| 2018/0017628 A1 | 1/2018 | Takegami et al. | |
| 2019/0113581 A1* | 4/2019 | Kawamura | G01R 31/382 |

FOREIGN PATENT DOCUMENTS

| | | |
|---|---|---|
| JP | 5606933 B2 | 10/2014 |
| WO | 2016132813 A1 | 8/2016 |

OTHER PUBLICATIONS

Extended European Search Report dated Mar. 23, 2020 for corresponding European patent application No. 17902760.2, 7 pages.
Office Action dated Sep. 29, 2020, issued in corresponding Japanese Patent Application No. 2019508542, 9 pages including 4 pages of English translation.
Office Action dated Apr. 8, 2021, by the Chinese Patent Office in corresponding Chinese Patent Application No. 201780088963.3 and English translation of the Office Action. (27 pages).
Office Action dated Nov. 2, 2021, by the Chinese Patent Office in corresponding Chinese Patent Application No. 201780088963.3 and English translation of the Office Action. (15 pages).

* cited by examiner

RECHARGEABLE BATTERY STATE ESTIMATION DEVICE

TECHNICAL FIELD

The present application relates to a rechargeable battery state estimation device which estimates stably the residual quantity, the capacity and others of a rechargeable battery.

BACKGROUND ART

In an electric vehicle, a railway carriage, or a fixed type power storage system, or the like, technologies for estimating the internal state of a rechargeable battery, such as a state of charge (SOC: State of Charge), a state of health (SOH: State of Health), and so forth, with a sufficient degree of accuracy, become important, in order to use the rechargeable battery in an efficient way. As an example of conventional technologies for estimating the SOC, a current integration method is known, which can estimate a present SOC, where measurement currents are integrated and divided by a full charge capacity (FCC: Full Charge Capacity). Further, as another example, known is an OCV estimation method, which is capable of calculating a SOC, by estimating an open circuit voltage (OCV: Open Circuit Voltage) of a rechargeable battery from a measured current, a measured voltage, and a rechargeable battery model, and using a corresponding relation between the OCV and the SOC of the rechargeable battery.

The SOC estimate value given by the above mentioned current integration method and the SOC estimate value given by the OCV estimation method have features which are different from each other.

In concrete words, while the SOC estimate value given by the current integration method can follow a short time change in SOC with a sufficient degree of accuracy, the SOC estimate value will be subject to the influence of the errors in each of the parameters of an SOC initial value, an SOH, and a current offset. Especially, because the errors in the current offset have the tendency to be integrated, estimation errors of the SOC become larger with the passage of time.

On the other hand, because the SOC estimate value given by the OCV estimation method estimates a SOC mainly using a measured voltage, the SOC estimation error does not expand, like errors by the current integration method. However, it is known that discontinuous changes are produced in the SOC estimate value and the OCV estimation method may provide a poor estimation accuracy, when the estimation is carried out within a short time, because the OCV estimation method is strongly subject to influences of the error in a rechargeable battery model parameter and the error in the voltage measurement, Therefore, many SOC estimation methods have been proposed, which have aimed at compensating faults in the both methods and, in addition, taking advantage of the both methods, by combining the current integration method and the OCV estimation method in a suitable manner.

For example, there is a technology for calculating an SOC based on two values, in which one value is computed by passing, through a high pass filter, an SOC estimate value which is estimated by the current integration method, and the other value is computed by passing, through a high pass filter, an SOC estimate value which is estimated by the current integration method (refer to Patent Document 1).

Further, as mentioned above, a technology for estimating the SOH with a sufficient degree of accuracy is also important. If the SOH can be estimated with a sufficient degree of accuracy, it will become possible to grasp the appropriate exchange time of a rechargeable battery, and in addition, the accuracy in the estimation of SOC can be improved.

As a specific example of the SOH estimation method, there is a technology in which a SOH estimate value (in another word, a rechargeable battery rating estimate value) having little influence of the current integration error can be calculated, where a charge rate changing amount by the current integration method and a charge rate changing amount by the OCV estimation method are used during a period when a charge-discharge current exceeds a predetermined threshold value (for example, refer to Patent Document 2).

CITATION LIST

Patent Literature

Patent Document 1: JP 5606933 B
Patent Document 2: JP 5419832 B

SUMMARY OF THE INVENTION

Technical Problem

There are, however, following issues in the conventional technologies.

According to the technology which is proposed in Patent Document 1, because parameters which lead to the SOC estimation error, such as a full charge capacity and a current offset of a battery, are not estimated, it is not possible to remove the SOC estimation error fundamentally, even if the SOC estimation error can be reduced with a filter. Further, the filter for reducing the SOC estimation error has also an issue in that the optimal filter set value changes, depending on the frequency characteristic of the current which is inputted into a rechargeable battery.

Further, according to the technology which is proposed in Patent Document 2, the SOH estimate value will be strongly affected by the influences of the error of the current integration and the error of an equivalent circuit parameter, if the integration hour of a time, during which the current value exceeds a threshold value, is not long enough. Therefore, as long as an approach toward reducing the error in the current integration is adopted for improving the estimation accuracy of the SOH, the influence of the error in the current integration cannot be removed fundamentally.

The present invention is made in order to solve the above mentioned issues, and an object of the present application is to obtain a rechargeable battery state estimation device which is capable of estimating the internal state of a battery with a more precise accuracy, compared with the conventional methods.

Solution to Problem

The rechargeable battery state estimation device according to the present application is a rechargeable battery state estimation device which estimates a state of charge of a rechargeable battery as an estimated state of charge, and includes: a current detecting unit which detects a charge-discharge current of the rechargeable battery as a detected current, a voltage detecting unit which detects a voltage between terminals of the rechargeable battery as a detected voltage, an OCV estimation method SOC estimation unit which calculates an OCV estimation method state of charge, based on the detected current and the detected voltage, a current integration method parameter estimation unit which estimates a current integration method parameter including a capacity retention rate, based on the detected current and the OCV estimation method state of charge, and a corrected SOC estimation unit which calculates an estimated state of charge, based on the detected current, the OCV estimation method state of charge, and the current integration method parameter.

Advantage of the Invention

According to the present application, it is possible to provide a rechargeable battery state estimation device, which employs a basic constitution in the combination of the OCV estimation method and the current integration method. The rechargeable battery state estimation device can estimate parameters in real time, owing to the effect of the current integration method parameter estimation unit, where the parameters lead to the error causes in the current integration method and include the capacity retention rate SOH, which is important as a deterioration index of the rechargeable battery. In addition, the rechargeable battery state estimation device can estimate the state of charge SOC stably and precisely, because the corrected SOC estimation unit corrects the state of charge estimation error, which results from errors in the capacity retention rate, the current offset, and the initial SOC estimate value, which are error causes in the current integration method. Furthermore, owing to the feed forward constitution, the rechargeable battery state estimation device is easy to mount, and has an advantage in that the disturbance of the estimate value in the downstream does not affect to the upper stream.

DESCRIPTION OF EMBODIMENTS

Hereinafter, explanation will be made about a battery state estimating device in accordance with the present application, using drawings in relevance of preferred embodiments. It is to be noted that identical signs are given to identical parts or corresponding parts, in the explanation of drawings, and overlapping explanation will be omitted. Here, the rechargeable battery state estimation device according to the present application estimates the internal state of a battery which is currently operated.

Further, as for "differential" and "integration", which appear in the description, those words are also used as terms which mean "difference" and "summation" respectively.

Embodiment 1

Figure 1:
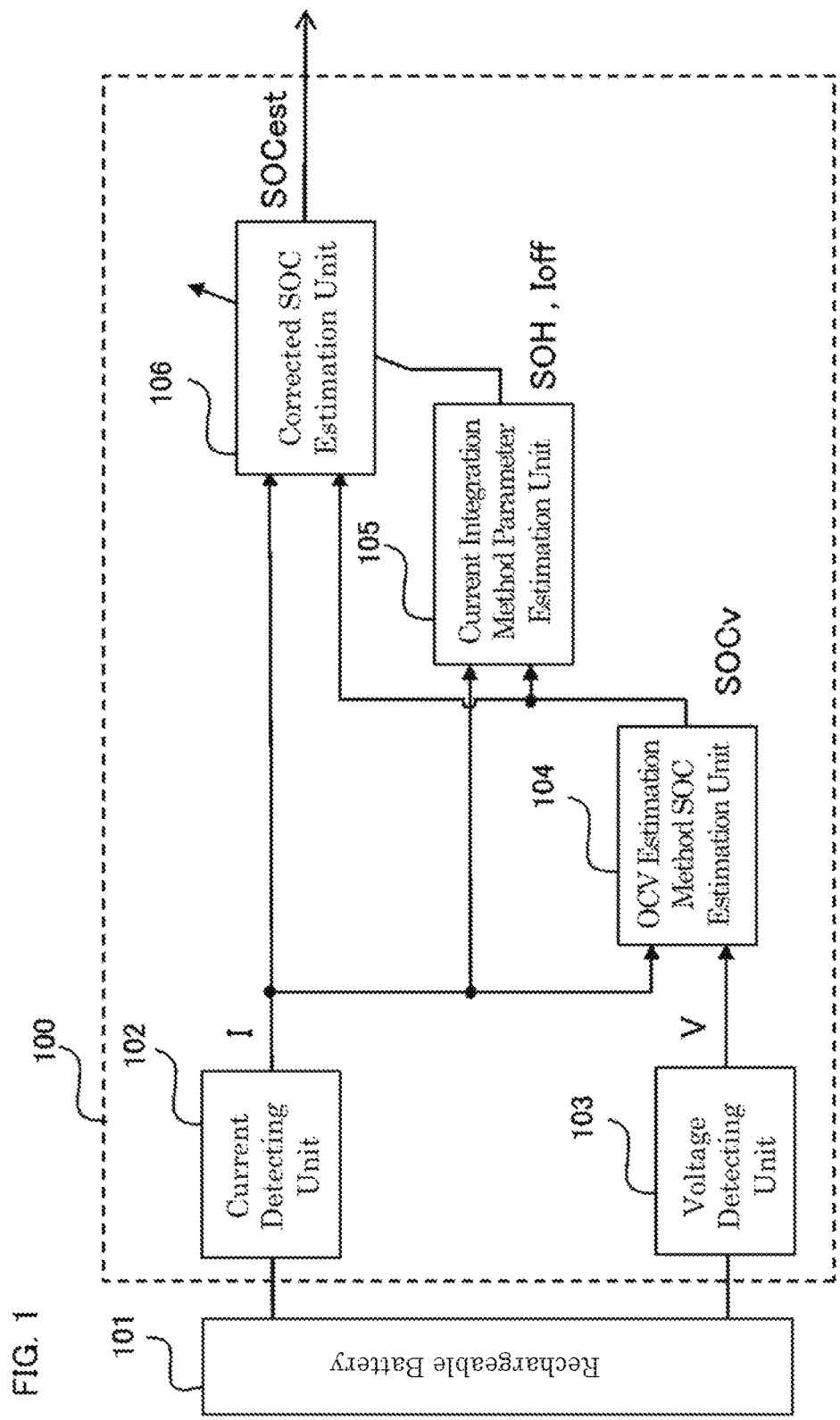
FIG. 1 is a configuration diagram of a rechargeable battery state estimation device in accordance with Embodiment 1 of the present application.

FIG. 1 is a configuration diagram of the rechargeable battery state estimation device 100 in accordance with Embodiment 1 of the present application. It is to be noted that a rechargeable battery 101, which will be connected to the rechargeable battery state estimation device 100, is also illustrated in FIG. 1.

Here, it is supposed that the rechargeable battery 101 is a lithium ion battery, for the sake of explanation which is made about the rechargeable battery state estimation device 100. The rechargeable battery 101 includes, however, power storage systems on the whole, which are capable of charging and discharging, and, for example, can be a lead storage battery, a nickel hydrogen rechargeable battery, or an electrical double layer capacitor. Further, the rechargeable battery 101 is supposed to have a cell. However, the rechargeable battery 101 may be a module, which is configured to have a plurality of cells in series connection or in parallel connection, or in the combination of the both.

In FIG. 1, the rechargeable battery state estimation device 100 is configured to have a current detecting unit 102, a voltage detecting unit 103, an OCV estimation method SOC estimation unit 104, a current integration method parameter estimation unit 105, and a corrected SOC estimation unit 106.

The current detecting unit 102 carries out a processing for current detection. That is to say, the current detecting unit 102 detects a charge-discharge current of the rechargeable battery 101 as a detected current I [A].

The voltage detecting unit 103 carries out a processing for voltage detection. That is to say, the voltage detecting unit 103 detects a voltage between terminals at the time of charging and discharging of the rechargeable battery 101, as a detected voltage V [V].

The OCV estimation method SOC estimation unit 104 carries out an SOC estimation processing by the OCV estimation method. That is to say, an OCV estimation method state of charge SOCv is calculated based on the detected current I which the current detecting unit 102 outputs and the detected voltage V which the voltage detecting unit 103 outputs.

The OCV estimation method, which is mentioned above, is a publicly known technology for estimating a SOC, in which an OCV is estimated based on a current, a voltage, and a battery model, and a corresponding relation between the OCV and the SOC of a battery is used.

It is to be noted that the process in which the OCV is estimated can include a process in which an OCV estimation method parameter is estimated. The OCV estimation method parameter refers to a parameter which is used in the OCV estimation method. For example, the OCV estimation method parameter includes a circuit parameter at the time when an equivalent circuit model is used as a rechargeable battery model; a physical chemistry parameter at the time when a detailed physical chemistry model is used as a rechargeable battery model; parameters which exhibit a corresponding relation between the SOC and the OCV, and its hysteresis characteristic, its temperature dependence, its degradation dependence, and others; measuring error parameters (for example, an offset error) of the current sensor and the voltage sensor; and the like. Typically, the OCV estimation method parameter is a resistance value, or a condenser capacitance value, or the like, which are circuit parameters of a rechargeable battery equivalent circuit model.

Further, publicly known estimation technologies can be used in the estimation of the OCV estimation method parameter and in the estimation of the OCV itself, and so forth. For example, various publicly known estimation technologies can be used, which include a recursive least squares method (RLS: Recursive Least Squares), a recursive total least squares method (RTLS: Recursive Total Least Squares), a recursive partial least squares method (RPLS: Recursive Partial Least Squares), a Kalman filter (KF: Kalman Filtering), and the like.

The current integration method parameter estimation unit 105 estimates a current integration method parameter, based on the detected current I which the current detecting unit 102 outputs and the OCV estimation method state of charge SOCv which the OCV estimation method SOC estimation unit 104 outputs.

In the current integration method parameter estimation unit 105, a current integration method parameter is estimated using an estimation technology, where an OCV estimation method state of charge SOCv or a value of the SOCv to which filtering process is performed is used as a reference signal.

Figure 2:
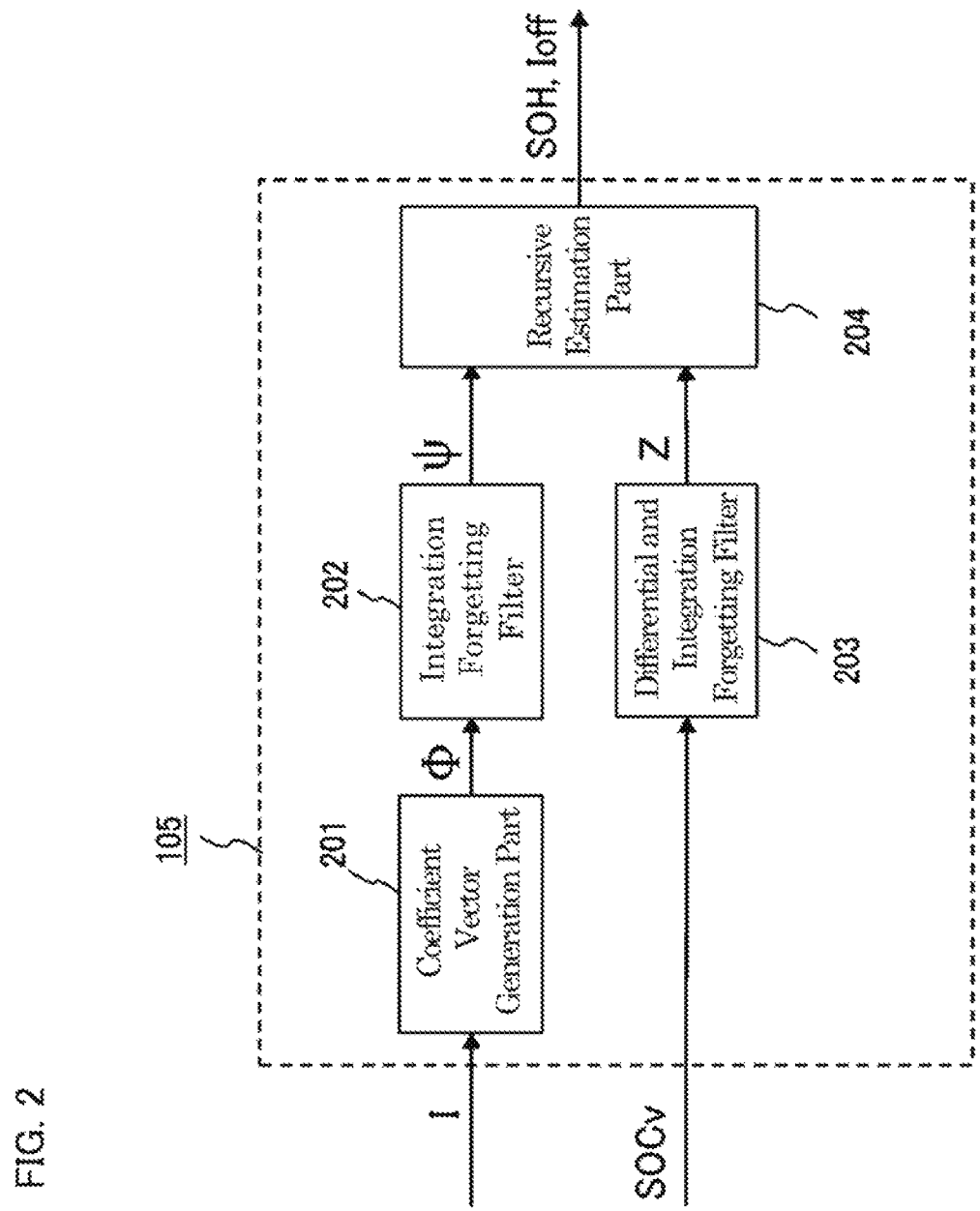
FIG. 2 is a configuration diagram of a current integration method parameter estimation unit in accordance with Embodiment 1 of the present application.

With reference to FIG. 2, explanation will be made about a practical example of the configuration of the current integration method parameter estimation unit 105.

FIG. 2 is a configuration diagram of the current integration method parameter estimation unit 105 in accordance with Embodiment 1 of the present application. As shown in FIG. 2, the current integration method parameter estimation unit 105 has a coefficient vector generation part 201, an integration forgetting filter 202, a differential and integration forgetting filter 203, and a recursive estimation part 204.

The coefficient vector generation part 201 calculates a coefficient vector φ (a first coefficient vector) which is denoted in Equation (1), based on the detected current I which the current detecting unit 102 outputs.

$$\varphi(k) = \left[ \frac{t_s}{FCC_n} I(k-1) - \frac{t_s}{FCC_n} \right]^T \quad \text{[Equation 1]}$$

Here, ts is a sampling period and FCCn is a rechargeable battery nominal capacity. FCCn may be a rated capacity, a brand newly measured capacity of the rechargeable battery 101, and the like.

It is to be noted that k is a sample time, and the relation of tk=kts can be established when tk is defined as a lapsed time from k=0.

The integration forgetting filter 202 calculates a coefficient vector ψ (a second coefficient vector), based on a coefficient vector φ (a first coefficient vector) which the coefficient vector generation part 201 outputs, by applying the operation of forgetting integration (integration with a forgetting coefficient) to the coefficient vector φ (the first coefficient vector). That is to say, the coefficient vector ψ (the second coefficient vector) is calculated, according to the updating equation of Equation (2).

[Equation 2]

$$\psi(k) = \mu(\psi(k-1) + \varphi(k)) \quad \text{Equation (2)}$$

Here, μ is a forgetting coefficient and satisfies 0<μ<=1.

The differential and integration forgetting filter 203 calculates a reference signal z, based on an OCV estimation method state of charge SOCv which the OCV estimation method SOC estimation unit 104 outputs, by applying the operation of forgetting integration to a differential value of the SOCv. That is to say, the reference signal z is calculated, according to the updating equation of Equation (3).

[Equation 3]

$$\psi(k) = \mu(z(k-1) + (SOC_v(k) - SOC_v(k-1))) \quad \text{Equation (3)}$$

Based on a certain recursive estimation method, the recursive estimation part 204 estimates a capacity retention rate SOH and a current offset Ioff, and outputs them as current integration method parameters.

As a recursive estimation method, the recursive least squares method is used representatively, where ψ is a coefficient vector and z is a reference signal. That is to say, the relation between them is represented like in Equation (4).

[Equation 4]

$$\varepsilon(k) = z(k) - \psi^T(k)\theta(k-1) \quad \text{Equation (4)}$$

$$\theta(k) = \theta(k-1) + \frac{P(k-1)\psi(k)}{\lambda + \psi^T(k)P(k-1)\psi(k)} \varepsilon(k)$$

$$P(k) = \frac{1}{\lambda}\left( P(k-1) - \frac{P(k-1)\psi(k)\psi^T(k)P(k-1)}{\lambda + \psi^T(k)P(k-1)\psi(k)} \right) \quad \text{Equation (4)}$$

Here, θ is an N×1 estimate value vector, ψ is a N×1 coefficient vector, P is a N×N covariance matrix, ε is an error signal, and λ (0<λ<=1) is a forgetting coefficient, when the number of estimate parameters in Equation (4) is set as N.

The estimate value vector θ is, however, defined as follows, in order to estimate a current integration method parameter.

[Equation 5]

$$\theta(k) := [1/SOH(k) I_{off}(k)/SOH(k)]^T \quad \text{Equation (5)}$$

Next, explanation will be made, with the introduction of equations, about the principle part in the estimation of the current integration method parameter, which is to be performed by the current integration method parameter estimation unit 105.

First of all, the state of charge SOC can be expressed generally as follows, if the detected current I is used.

[Equation 6]

$$SOC(k+1) = SOC(k) + \frac{t_s}{FCC_n \cdot SOH}(I(k) - I_{off})\quad\text{Equation (6)}$$

In Equation (6), it is considered that the current offset Ioff is contained in the detected current I, and a model, in which the current offset Ioff is subtracted from the detected current I and the remainder will be integrated, is formed. Therefore, the model can be referred to as a current integration method with amendment (an amended current integration method). In the right hand side second term of Equation (6), which shows a change of the state of charge, if precise values of the capacity retention rate SOH and the current offset Ioff are known, it will become possible to attain the SOC estimation, with a higher degree of accuracy than that of the usual current integration method.

On the other hand, the OCV estimation method uses mainly the voltage information, and is a method of estimating SOC of every clock time from the corresponding relation between the SOC and the OCV of a rechargeable battery. Accordingly, the estimation method state of charge SOCv by the OCV estimation method is not subject to the influence of the SOH error, because current offset errors are hardly accumulated in principle, and in addition, the capacity retention rate SOH is not used for estimation. Therefore, when hourly averaged for a long time, the OCV estimation method state of charge SOCv will exhibit a value which is close to the true value.

Then, an idea comes to mind, in which an OCV estimation method state of charge SOCv is used to estimate the capacity retention rate SOH and the current offset Ioff, which are the current integration method parameter estimation value vector in Equation (5). Equation (7), which is shown in the next part, will be gained, when equation transformation is performed based on Equation (6), where a capacity retention rate estimate value SOH (k−1) and a current offset estimate value Ioff (k−1) at time k−1 are used.

[Equation 7]

$$\Delta SOC(k) := SOC(k) - SOC(k-1)$$

$$= \frac{t_s}{FCC_n \cdot SOH(k-1)}(I(k-1) - I_{off}(k-1))$$

$$= \left[\frac{t_s}{FCC_n}I(k-1) - \frac{t_s}{FCC_n}\right] \cdot \begin{bmatrix} \frac{1}{SOH(k-1)} \\ \frac{I_{off}(k-1)}{SOH(k-1)} \end{bmatrix}$$

$$= \varphi^T(k)\theta(k-1)$$

Then, the current integration method parameter estimation value vector θ can be estimated in principle, if ΔSOCv (k) (:=SOCv (k)−SOCv (k−1)) is used as a reference signal ΔSOC (k) at the left hand side, and Equation (1) is used as φ at the right hand side, and the recursive least squares method is applied.

In practice, there are, however, many cases in which a stable estimate value is hard to obtain, because ΔSOCv is large in the high frequency error. Inherently, the OCV estimation method state of charge SOCv is large, by its nature, in high frequency errors, due to the voltage measuring error, the error of a rechargeable battery model, and so forth. Further, if ΔSOCv, which is computed by differentiating such an OCV estimation method state of charge SOCv, is employed, the high frequency error will become far larger, and the parameter estimation will become difficult to attain due to problems of the SN ratio.

Then, the operation of forgetting integration will be applied to the ΔSOCv and the coefficient vector φ (the first coefficient vector), in order to eliminate the high frequency error. That is to say, calculations in Equation (2) and Equation (3) will be performed. It is to be noted that an output value which is computed by passing a ΔSOCv through an integration forgetting filter is equal to an output value which is computed by passing a SOCv through a differential and integration forgetting filter. The value of the forgetting coefficient μ in Equation (2) and Equation (3) can be decided, depending on the magnitude of the high frequency error, the speed of change in the estimate parameter, and the value of a forgetting coefficient in the recursive least squares method, and the like. Forgetting integration is like an operation in which values are integrated, while the past data are slipped out of memory gradually. Forgetting speed becomes slower, as the value of μ becomes larger, and the forgetting integration becomes a usual integrator when μ=1.

Finally, the recursive least squares method will be applied, where the calculated ψ is employed as a coefficient vector and z is employed as a reference signal.

Processing with an integration forgetting filter, which is employed before applying the recursive least squares method, can reduce the high frequency error and improves the SN ratio, due to the effect of the integration. In addition, it becomes possible to correspond also to the variation in the estimate parameter, due to the effect of a forgetting coefficient. Further, integration operation produces a problem in which the absolute value of each element of a coefficient vector increases endlessly with the passage of time, and attention needs to be paid to the fact that this problem can be avoided due to the effect of a forgetting coefficient.

The current integration method parameter estimation unit 105, which is configured to realize operations that follow the above mentioned principle, can estimate a current integration method parameter, stably and precisely.

The corrected SOC estimation unit 106, which estimates an estimated state of charge SOCest, based on a detected current I which the current detecting unit 102 outputs, an OCV estimation method state of charge SOCv which the OCV estimation method SOC estimation unit 104 outputs, and a current integration method parameter which the current integration method parameter estimation unit 105 outputs, outputs the estimated state of charge SOCest.

In the corrected SOC estimation unit, the amended current integration method is basically employed, where a current integration method parameter which is estimated in the current integration method parameter estimation unit 105 is used. In addition, the corrected SOC estimation unit removes an amended current integration method state of charge estimation error, using the OCV estimation method state of charge SOCv, where the amended current integration method state of charge estimation error, which is due to the error causes of the current integration method, was not estimated in the current integration method parameter estimation unit 105. Accordingly, the corrected SOC estimation unit can calculate an estimated state of charge SOCest, with accuracy higher than the amended current integration method state of charge SOCi and the OCV estimation method state of charge SOCv.

Figure 3:
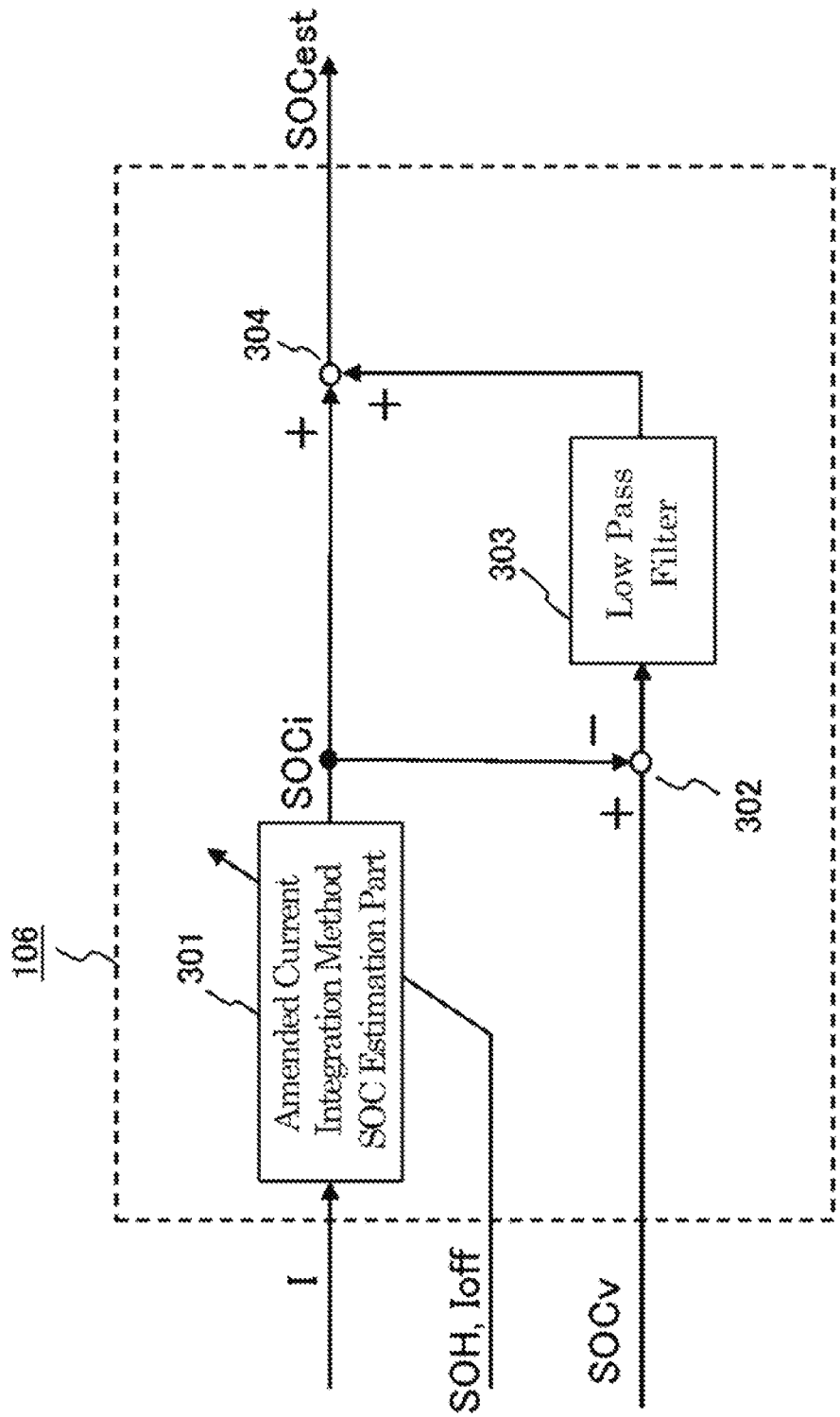
FIG. 3 is a configuration diagram of a corrected SOC estimation unit in accordance with Embodiment 1 of the present application.

With reference to FIG. 3, explanation will be made about an example of the practical configuration of the corrected SOC estimation unit 106. FIG. 3 is a configuration diagram of the current integration method parameter estimation unit 105 in accordance with Embodiment 1 of the present application. In FIG. 3, the corrected SOC estimation unit 106 has an amended current integration method SOC estimation part 301, a subtraction part 302, a low pass filter 303, and an adder part 304.

The amended current integration method SOC estimation part 301 calculates an amended current integration method state of charge SOCi by the current integration method, based on the detected current I which the current detecting unit 102 outputs and the current integration method parameter which the current integration method parameter estimation unit 105 outputs. However, the updating rule of Equation (6) is used, in the calculation of the amended current integration method state of charge SOCi. It is to be noted that an initial value of the amended current integration method state of charge SOCi is calculated, by converting a detected voltage V at an estimation start time into a SOC, where the corresponding relation between the SOC and the OCV, which has been previously stored as map data, is employed. Or, the last time value of the estimated state of charge SOCest may be used as an initial value.

The subtraction part 302 subtracts an amended current integration method state of charge SOCi, which the amended current integration method SOC estimation part 301 outputs, from an OCV estimation method state of charge SOCv, which the OCV estimation method SOC estimation unit 104 outputs, and outputs the value of the remainder.

The low pass filter 303 outputs a low pass filtered value of the remainder, which the subtraction part 302 outputted.

For example, as a low pass filter 303, the process which is denoted by the following equation is used, when an input value is set as u and an output value is set as y.

[Equation 8]

$$y(k)=w_1 y(k-1)+w_2 u(k) \quad \text{Equation (8)}$$

Here, w1 and w2 are forgetting coefficients. The process will be referred to as an index moving average filter, when $0<w1<1$ and $w2=1-w1$; and referred to as a forgetting integrator, when $0<w1=w2<1$; and become a usual integrator, when $w1=w2=1$. As a feature of a forgetting coefficient, the process becomes harder to forget the information on the past value of u, which is contained in y, as w1 becomes larger. In a typical case according to Embodiment 1 of the present application, the index moving average filter is used as a low pass filter. It is to be noted that values of w1, w2 and others may be designed as time varying parameters.

The adder part 304 calculates an estimated state of charge SOCest, which is computed by adding an amended current integration method state of charge SOCi which the amended current integration method SOC estimation part 301 outputs, and a value which the low pass filter 303 outputs. Owing to the effects of the subtraction part 302, the low pass filter 303, and the adder part 304, the calculated estimated state of charge SOCest will become a state of charge estimate value, which has accuracy far higher than the amended current integration method state of charge SOCi.

The amended current integration method state of charge SOCi includes initial state of charge estimation errors; high frequency errors, excluding the current offset which is contained in the detected current I; and almost constant low frequency errors, that are induced by the storage of small estimation errors and the like, which are included in the estimated current integration method parameters; and so forth. Then, when the estimated state of charge SOCest is calculated, the SOCest will become more precise than the SOCi, where the OCV estimation method state of charge SOCv, time average of which is close to a true value, is employed as a reference signal, and this orbit is brought closer to the orbit of the amended current integration method state of charge SOCi.

However, since the OCV estimation method state of charge SOCv includes errors by the high frequency component, a difference value between the SOCv and the SOCi is made to pass through a low pass filter. The difference value, which is reduced in the high frequency component, is added to the SOCi. These operations are realized in the subtraction part 302, the low pass filter 303, and the adder part 304.

Figure 4:
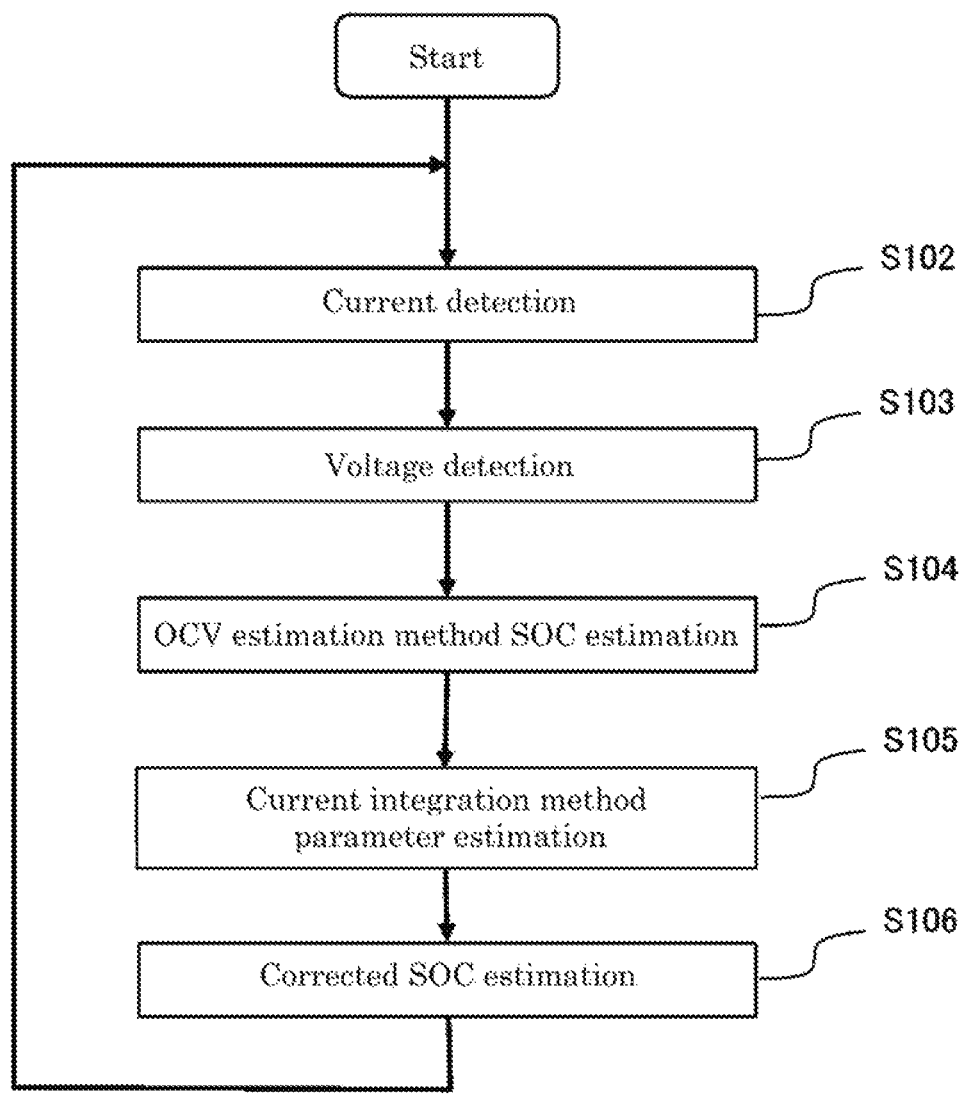
FIG. 4 is a flow diagram for showing a series of operations which the rechargeable battery state estimation device in accordance with Embodiment 1 of the present application performs.
Figure 5:
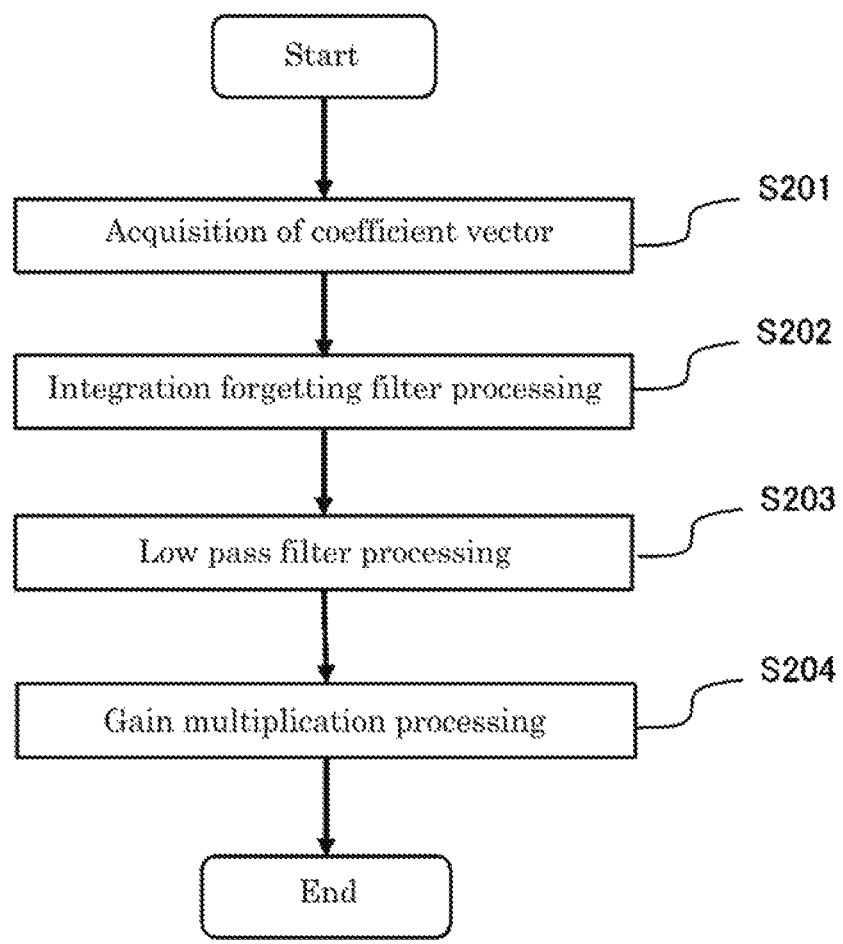
FIG. 5 is a flow diagram for showing a series of operations which a current integration method parameter estimation unit in accordance with Embodiment 1 of the present application performs.
Figure 6:
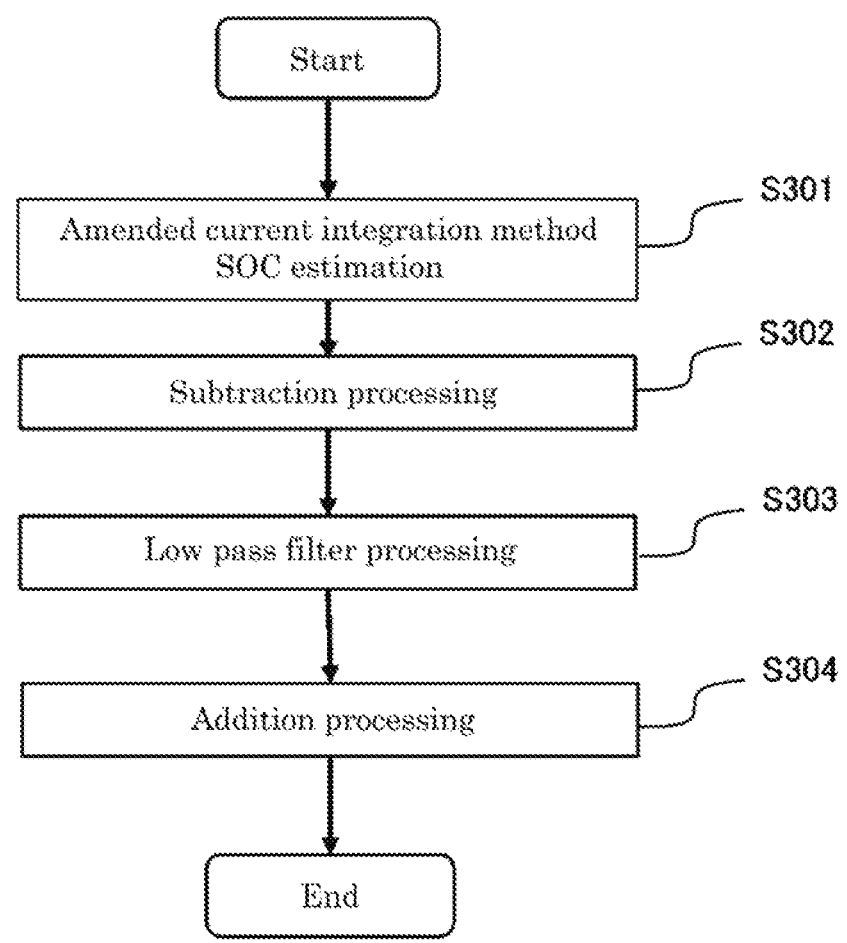
FIG. 6 is a flow diagram for showing a series of operations which the rechargeable battery state estimation device in accordance with Embodiment 1 of the present application performs.

Next, explanation will be made about a series of operations, which is performed in a case where the rechargeable battery state estimation device 100 according to Embodiment 1 of the present application estimates a state of charge of the rechargeable battery 101, with reference to the flow diagrams in FIG. 4 to FIG. 6. FIG. 4 is a flow diagram for showing a series of operations which is performed in the rechargeable battery state estimation device 100 according to Embodiment 1 of the present application. FIG. 5 is a flow diagram for showing a series of operations which is performed in the current integration method parameter estimation unit 105 according to Embodiment 1 of the present application. FIG. 6 is a flow diagram for showing a series of operations which is performed in the corrected SOC estimation unit 106 according to Embodiment 1 of the present application.

It is to be noted that a series of operational treatments of Step S102 to Step S106, which are shown in FIG. 4, exhibit one period of operational treatments in the rechargeable battery state estimation device 100, and these operational treatments are repeated, every sampling period ts.

Further, a series of operational treatments of Step S201 to Step S204, which are shown in FIG. 5, are operational treatments which are performed at Step S105, which is shown in FIG. 4. Furthermore, a series of operational treatments of Step S301 to Step S304, which are shown in FIG. 6, are operational treatments which are performed at Step S106, which is shown in FIG. 4.

Here, the number of each step in the respective flow diagrams of FIG. 4 to FIG. 6 corresponds to a component part of the rechargeable battery state estimation device 100. That is to say, as mentioned above, each component part of the rechargeable battery state estimation device 100 will perform a step, which exhibits the same number as the step in the respective flow diagrams of FIG. 4 to FIG. 6.

As shown in FIG. 4, the rechargeable battery state estimation device 100 performs a series of operational treatments of Step S102 to Step S106, every sampling period ts.

Further, in Step S105, the rechargeable battery state estimation device 100 performs a series of operational treatments of Step S201 to Step S204, which are shown in FIG. 5. Furthermore, in Step S106a, the rechargeable battery state estimation device 100 performs a series of operational treatments of Step S301 to Step S304, which are shown in FIG. 6.

It is to be noted that, concerning each step of respective flow diagrams in FIG. 4 to FIG. 6, the order of steps which are performed in the rechargeable battery state estimation device 100 is not limited to the order of steps which are shown in each of the drawings. As long as the dependency relation of respective steps is not spoiled, the exchange in the execution sequence is permitted.

As mentioned above, according to Embodiment 1 of the present application, it becomes possible to estimate a capacity retention rate SOH, which is separated from errors of the current offset Ioff, by the effect of the current integration method parameter estimation unit 105. Further, by the effect of the corrected SOC estimation unit 106, it becomes possible to estimate a highly accurate state of charge, which is corrected in all the errors, composed of the capacity retention rate SOH which is an error cause in the current integration method; the errors of the current offset Ioff; and initial SOC errors. These features are the ones which are common to the rechargeable battery state estimation device of the present application.

In addition, the configuration of FIG. 1 is in the feed forward constitution, on the whole.

That is to say, the rechargeable battery state estimation device is configured not to feed back a downstream signal to the upper stream. Accordingly, the rechargeable battery state estimation device has the advantage in that the disturbance of the estimate value in the downstream does not affect the upper stream. Further, the feed forward constitution does not introduce any change in the configuration of the OCV estimation method, which is a conventional technology, and Embodiment 1 of the present application can be realized, only by adding the current integration method parameter estimation unit 105 and the corrected SOC estimation unit 106, in the downstream. Therefore, in that meaning, the feed forward constitution has an advantage that its mounting is easy to attain. These features are the ones which are common to Embodiment 1 of the present application and Embodiments 2 and 3, which will be described below.

The feature of Embodiment 1 of the present application is in the point that, in the corrected SOC estimation unit 106, all of the internal configurations are also in the feed forward constitution. Owing to that, there is no possibility that the oscillating phenomenon and the divergent phenomenon in the estimate value may be generated, like in a feed back constitution. Further, the feed forward correction, which is performed by the subtraction part 302, the low pass filter 303, and the adder part 304, has an advantage that gain tuning is unnecessary, because the feed forward correction does not have a gain adder part, which will be described below in Embodiments 2 and 3.

Embodiment 2

Figure 7:
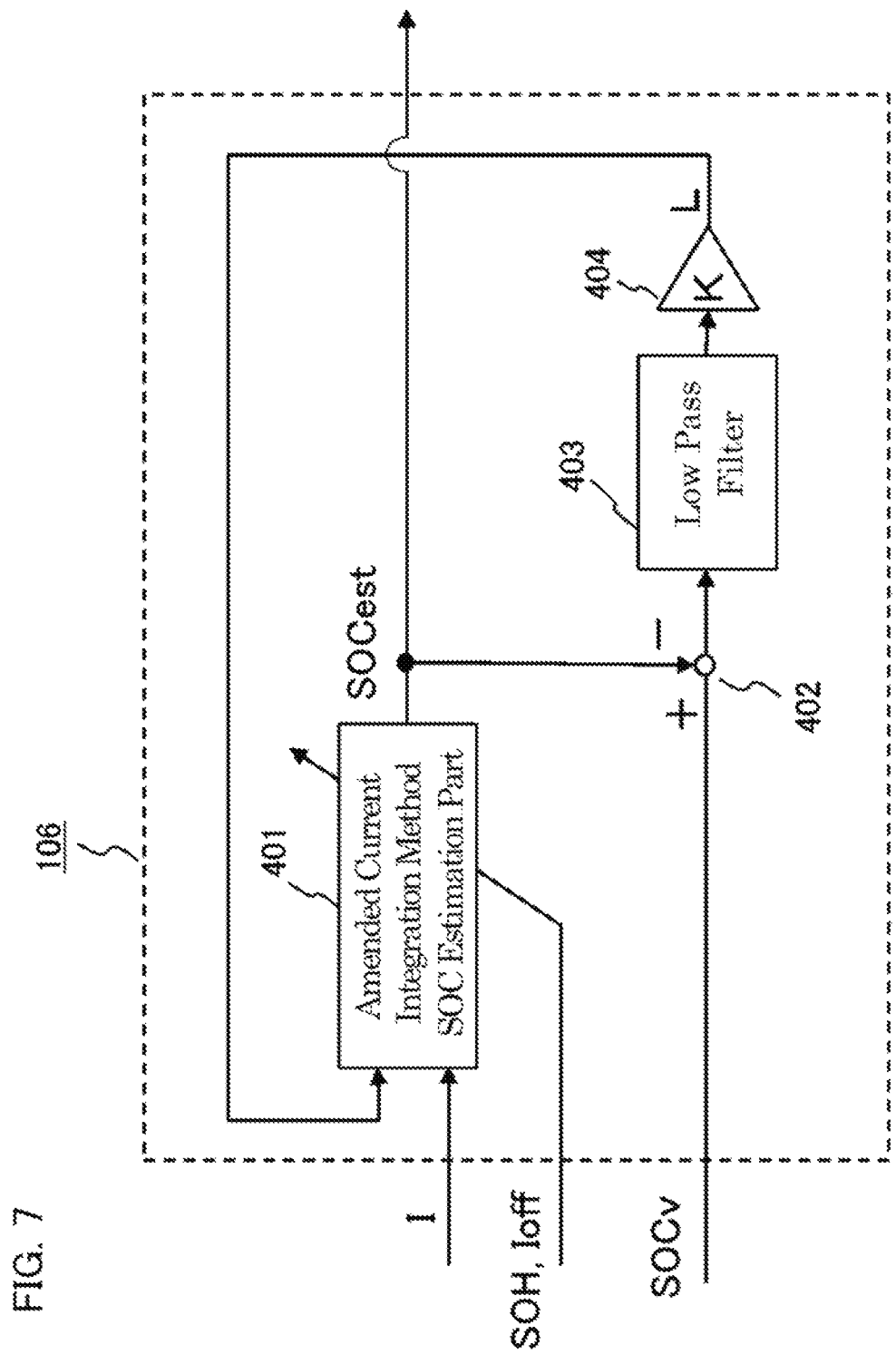
FIG. 7 is a configuration diagram of a corrected SOC estimation unit in accordance with Embodiment 2 of the present application.

Explanation will be made about a rechargeable battery state estimation device, in accordance with Embodiment 2 of the present application. The basic constitution of Embodiment 2 is illustrated in FIG. 1, like in Embodiment 1, and the internal configuration of the corrected SOC estimation unit 106 is different, as is shown in FIG. 7. Other configurations are identical with or the same as those, which were explained in Embodiment 1.

Explanation will be made about an example of the practical configuration of the corrected SOC estimation unit 106, with reference to FIG. 7.

In FIG. 7, the corrected SOC estimation unit 106 has an amended current integration method SOC estimation part 401, a subtraction part 402, a low pass filter 403, and a gain multiplication part 404.

The amended current integration method SOC estimation part 401 calculates an estimated state of charge SOCest, based on a detected current I which the current detecting unit 102 outputs, a current integration method parameter which the current integration method parameter estimation unit 105 outputs, and a value L which a later mentioned gain multiplication part 404 outputs.

The following updating rule is used, however, in the calculation of the estimated state of charge SOCest.

$$SOC_{est}(k) = SOC_{est}(k-1) + \frac{t_s}{FCC_n \cdot SOH(k-1)}(I(k-1) - I_{off}(k-1)) + L(k-1) \qquad \text{[Equation 9]}$$

The subtraction part 402 subtracts an estimated state of charge SOCest which the amended current integration method SOC estimation part 401 outputs, from an OCV estimation method state of charge SOCv which the OCV estimation method SOC estimation unit 104, and outputs the value of the remainder.

The low pass filter 403 outputs a low pass filtered value of the remainder, which the subtraction part 402 outputted.

For example, as a low pass filter 403, a process which is denoted by Equation (8) can be used.

The gain multiplication part 404 outputs a value L, which is computed by multiplying a value, which the low pass filter 403 outputted, by a gain K of positive real number.

Figure 8:
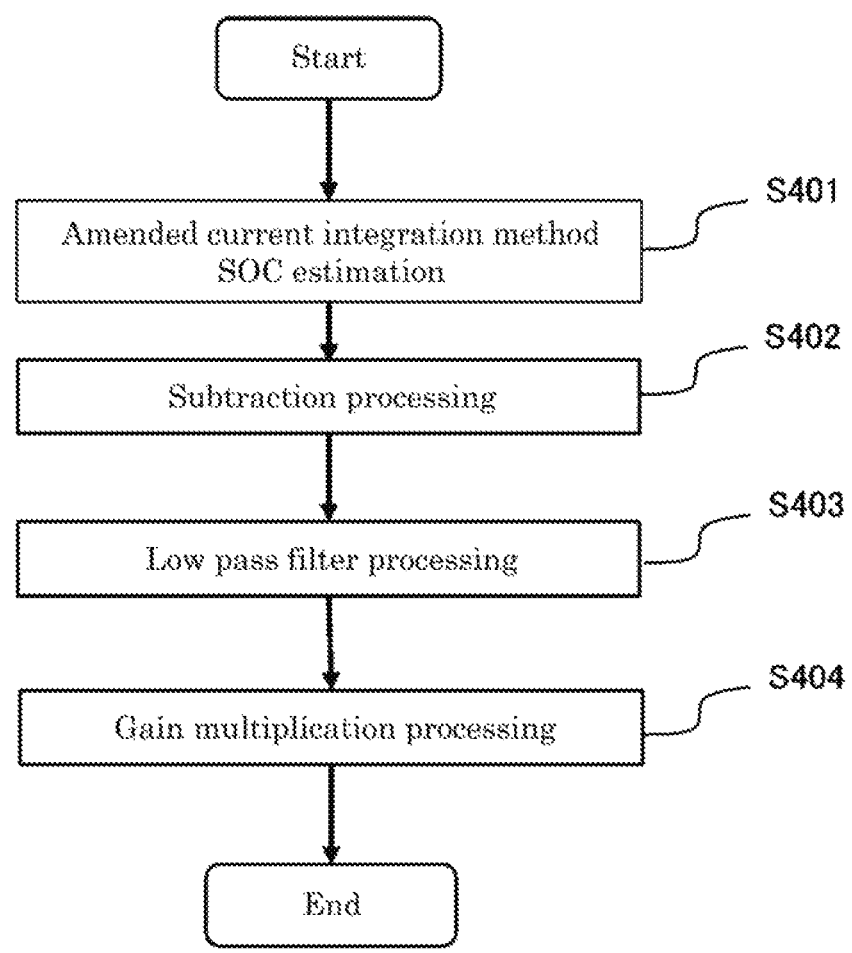
FIG. 8 is a flow diagram for showing a series of operations which a rechargeable battery state estimation device in accordance with Embodiment 2 of the present application performs.

Next, explanation will be made about a series of operations which is performed in a case where the rechargeable battery state estimation device 100 according to Embodiment 2 of the present application estimates a state of charge of the rechargeable battery 101, with reference to the flow diagrams of FIG. 4, FIG. 5, and FIG. 8. However, because operations of FIG. 4 and FIG. 5 are the same as in Embodiment 1, they are omitted, and hereinafter, only the differences from Embodiment 1 will be explained. FIG. 8 is a flow diagram for showing a series of operations which the corrected SOC estimation unit 106 according to Embodiment 2 of the present application performs.

A series of operational treatments of Step S401 to Step S404, which are shown in FIG. 8, are operational treatments which will be performed at Step S106 which is shown in FIG. 4.

Here, the number of each step in the respective flow diagrams of FIG. 4 to FIG. 6 corresponds to a component part of the rechargeable battery state estimation device 100. That is to say, as mentioned above, each component part of the rechargeable battery state estimation device 100 will perform a step, which exhibits the same number as the step in the respective flow diagrams of FIG. 4, FIG. 5, and FIG. 8.

In Step S106, the rechargeable battery state estimation device 100 performs a series of operational treatments of Step S401 to Step S404, which are shown in FIG. 8.

It is to be noted that, concerning each step of respective flow diagrams in FIG. 4, FIG. 5, and FIG. 8, the order of steps which are performed in the rechargeable battery state estimation device 100 is not limited to the order of steps which are shown in each of the drawings. As long as the dependency relation of respective steps is not spoiled, the exchange in the execution sequence is permitted.

As mentioned above, according to Embodiment 2 of the present application, the feed back constitution makes it possible to realize the error correction in the estimated state of charge SOCest of the amended current integration method.

Embodiment 3

Explanation will be made about a rechargeable battery state estimation device in accordance with Embodiment 3 of the present application. Because the configuration diagram of Embodiment 3 is illustrated in FIG. 1, like in Embodiment 1 and Embodiment 2, and difference exists only in the internal configuration of the corrected SOC estimation unit 106, the description to other configurations is omitted.

Figure 9:
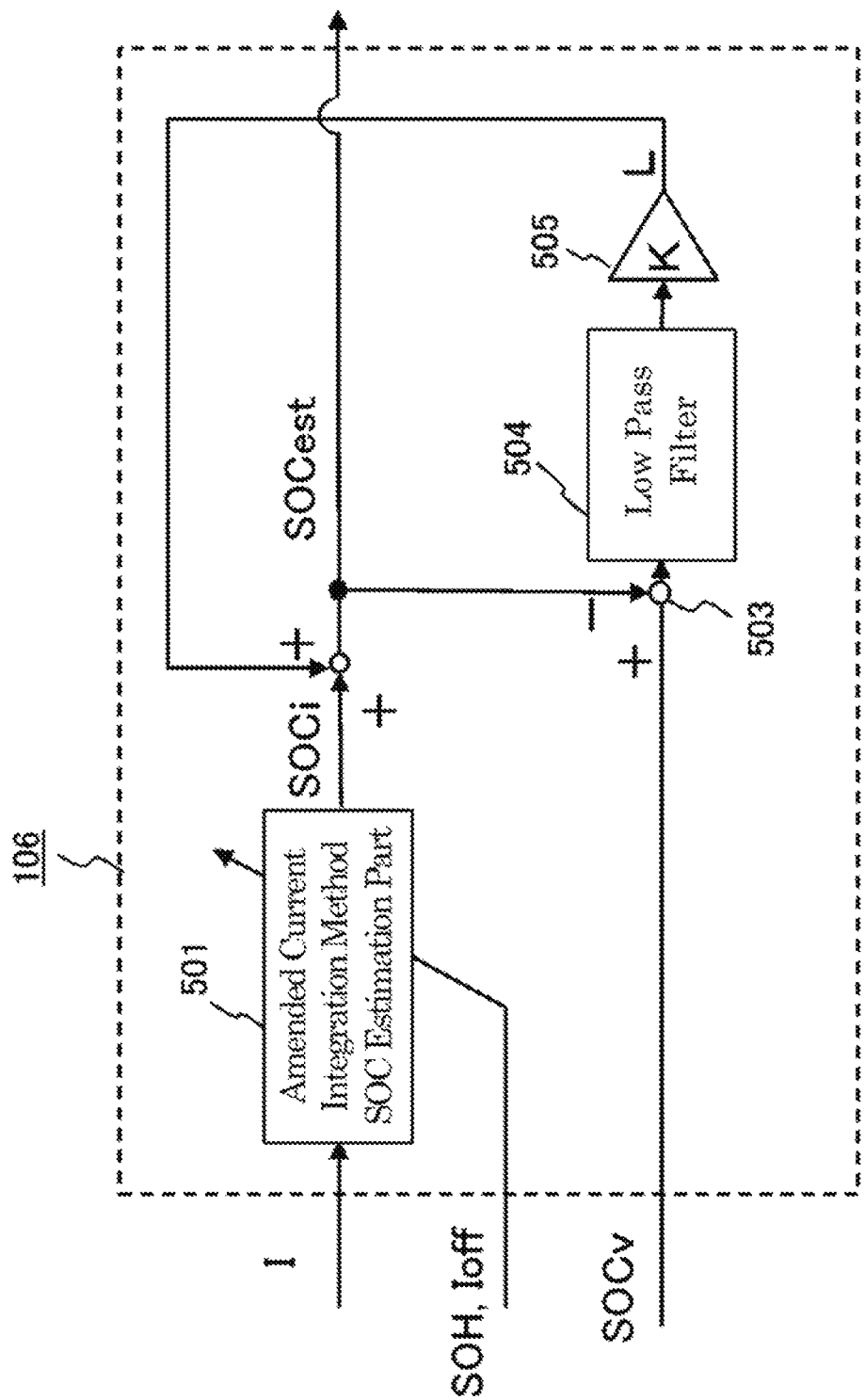
FIG. 9 is a configuration diagram of a corrected SOC estimation unit in accordance with Embodiment 3 of the present application.

With reference to FIG. 9, explanation will be made about an example of the practical configuration of the corrected SOC estimation unit 106.

As shown in FIG. 9, the corrected SOC estimation unit 106 has an amended current integration method SOC estimation part 501, an adder part 502, a subtraction part 503, a low pass filter 504, and a gain multiplication part 505.

The amended current integration method SOC estimation part 501 outputs an amended current integration method state of charge SOCi, by the similar processing in the amended current integration method SOC estimation part 301.

The adder part 502 outputs an estimated state of charge SOCest, which is computed by adding an amended current integration method state of charge SOCi which the amended current integration method SOC estimation part 501 outputs, and a value L which a later mentioned gain multiplication part 505 outputs.

The subtraction part 503 subtracts an estimated state of charge SOCest, which the adder part 502 outputs, from an OCV estimation method state of charge SOCv, which the OCV estimation method SOC estimation unit 104 outputs, and outputs the value of the remainder.

The low pass filter 504 outputs a low pass filtered value of the remainder, which the subtraction part 502 outputted.

For example, as a low pass filter 504, a process which is denoted by Equation (8) can be used.

The gain multiplication part 505 outputs a value L, which is computed by multiplying a value, which the low pass filter 504 outputs, by a gain K of positive real number.

Figure 10:
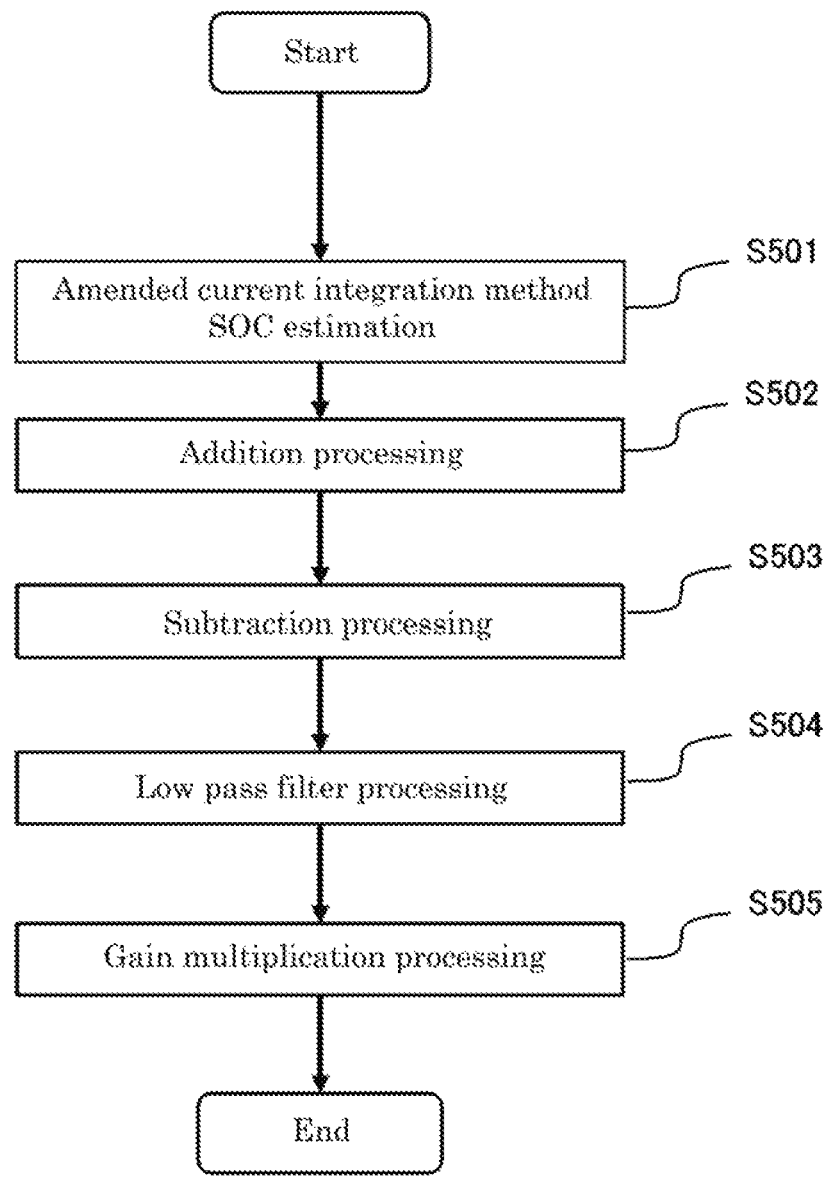
FIG. 10 is a flow diagram for showing a series of operations which a rechargeable battery state estimation device in accordance with Embodiment 3 of the present application performs.

Next, explanation will be made about a series of operations which will be performed in a case where the rechargeable battery state estimation device 100 according to Embodiment 3 of the present application estimates a state of charge of the rechargeable battery 101, with reference to the flow diagrams of FIG. 4, FIG. 5, and FIG. 10. However, since operations of FIG. 4 and FIG. 5 are the same as in Embodiment 1 and Embodiment 2, they are omitted, and hereinafter, only the differences from Embodiment 1 and Embodiment 2 will be explained. FIG. 10 is a flow diagram for showing a series of operations which is performed in the corrected SOC estimation unit 106 of Embodiment 3 of the present application.

A series of operational treatments of Step S501 to Step S505, which are shown in FIG. 10, are operational treatments that will be performed at Step S106, which is shown in FIG. 4.

Here, the number of each step in the respective flow diagrams of FIG. 4, FIG. 5 and FIG. 6 corresponds to a component part of the rechargeable battery state estimation device 100. That is to say, as mentioned above, each component part of the rechargeable battery state estimation device 100 will perform a step, which exhibits the same number as the step in the respective flow diagrams of FIG. 4, FIG. 5, and FIG. 10.

In Step S106, the rechargeable battery state estimation device 100 performs a series of operational treatments of Step S501 to Step S505, which are shown in FIG. 10.

It is to be noted that, concerning each step of respective flow diagrams in FIG. 4, FIG. 5, and FIG. 10, the order of steps which are performed in the rechargeable battery state estimation device 100 is not limited to the order of steps which are shown in each of the drawings. As long as the dependency relation of respective steps is not spoiled, the exchange in the execution sequence is permitted.

As mentioned above, according to Embodiment 3 of the present application, a partial feed back constitution makes is possible to realize the error correction of the estimating method state of charge SOCv, without introducing the change in the operation of the amended current integration method SOC estimation part.

Embodiment 4

Explanation will be made about a rechargeable battery state estimation device, in accordance with Embodiment 4 of the present application. The configuration diagram of Embodiment 4 is illustrated in FIG. 11.

Figure 11:
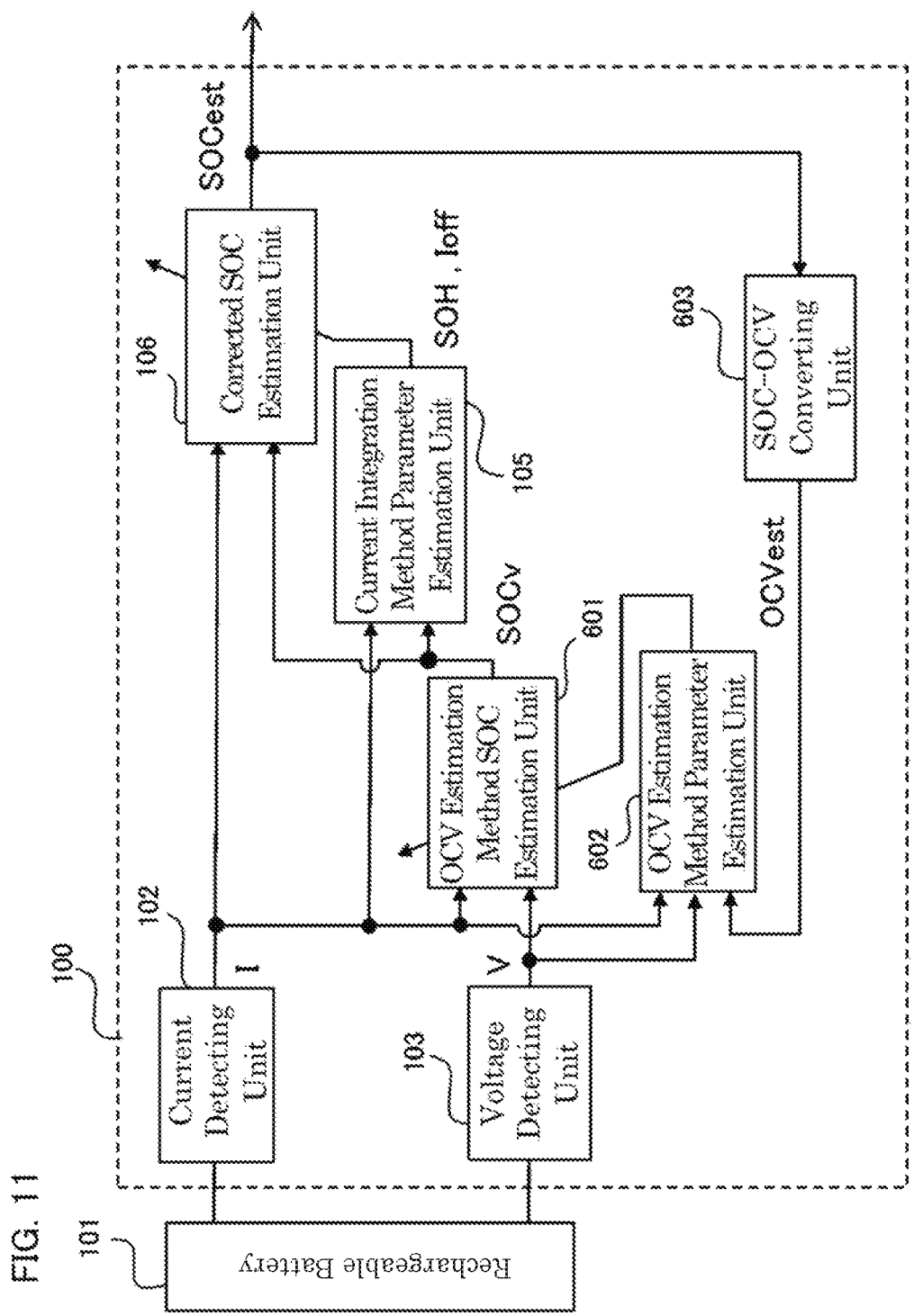
FIG. 11 is a configuration diagram of a rechargeable battery state estimation device in accordance with Embodiment 4 of the present application.

In FIG. 11, the rechargeable battery state estimation device 100 is configured to have a current detecting unit 102, a voltage detecting unit 103, a current integration method parameter estimation unit 105, a corrected SOC estimation unit 106, an OCV estimation method SOC estimation unit 601, an OCV estimation method parameter estimation unit 602, and a SOC–OCV converting unit 603. Because FIG. 11 includes the same component parts as in FIG. 1, the explanation about those parts is omitted.

The OCV estimation method SOC estimation unit 601 outputs an OCV estimation method state of charge SOCv, based on a detected current I which the current detecting unit 102 outputs, a detected voltage V which the voltage detecting unit 103 outputs, and an OCV estimation method parameter which a later mentioned OCV estimation method parameter estimation unit outputs.

The OCV estimation method parameter estimation unit 602 calculates an OCV estimation method parameter, based on a detected current I which the current detecting unit 102 outputs, a detected voltage V which the voltage detecting unit 103 outputs, and an estimated open circuit voltage OCVest which the SOC–OCV converting unit 603 outputs.

In the OCV estimation method parameter estimation unit 602, it is possible to use publicly known technologies, such as the recursive least squares method, in the calculation of the OCV estimation method parameter.

In the case where the OCV estimation method parameter is estimated from a current and a voltage, without introducing the use of the estimated open circuit voltage OCVest, it is necessary to estimate not only an OCV estimation method parameter but also an open circuit voltage OCV. However, in the case where the estimated open circuit voltage OCVest is used, the OCV estimation method parameter can be estimated from an overvoltage of the rechargeable battery, on the assumption that the open circuit voltage OCV is already known. Accordingly, estimate parameters can be reduced in number, and furthermore, the present embodiment has an advantage that the estimate value is likely to become more stable and/or more accurate one.

The SOC–OCV converting unit 603 converts an estimated state of charge SOCest, which the corrected SOC estimation unit 106 outputs, into an estimated open circuit voltage OCVest. In the process of converting a state of charge into an open circuit voltage, the corresponding relation between the two, which has been previously measured, can be used as map data.

Figure 12:
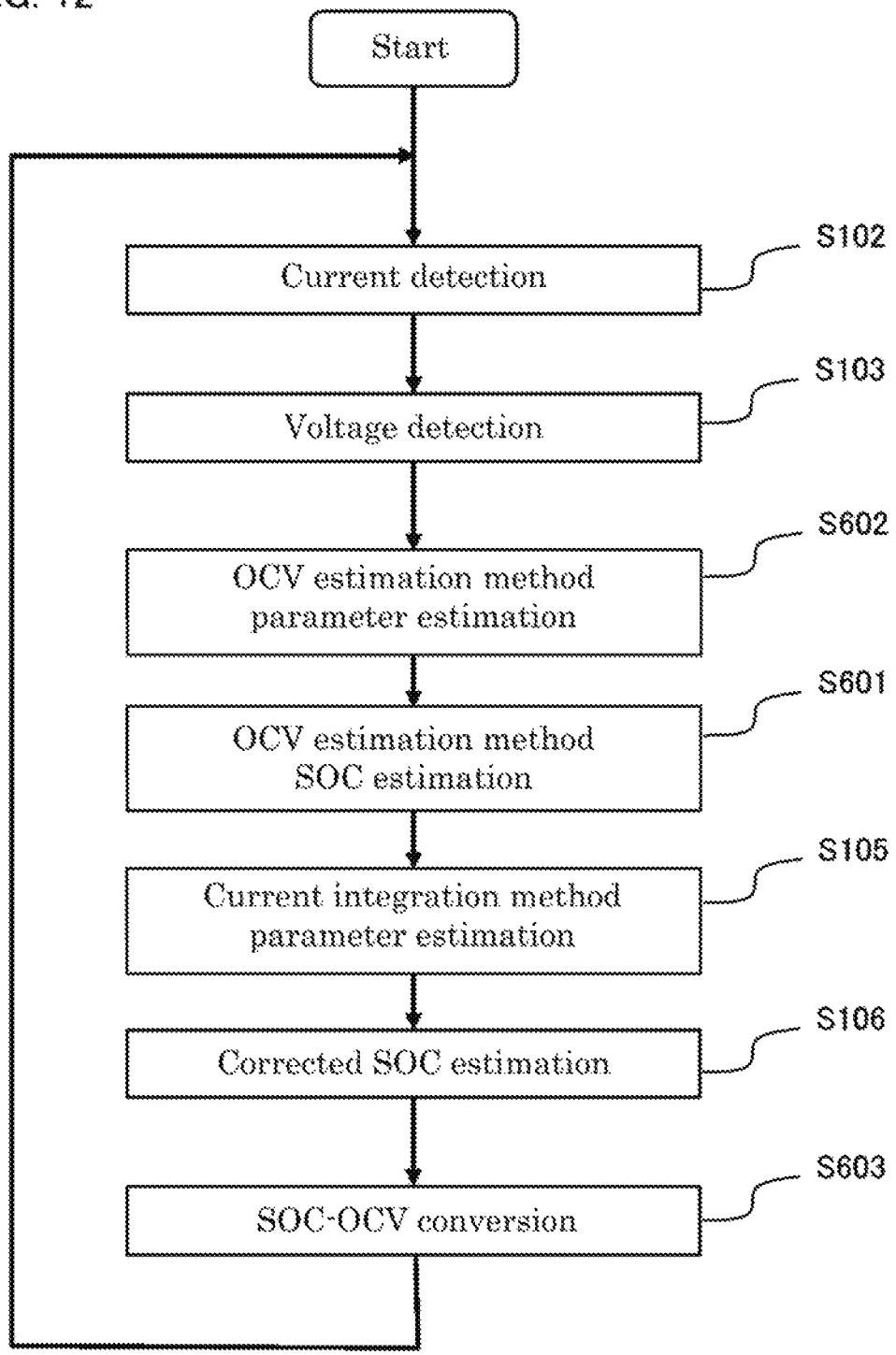
FIG. 12 is a flow diagram for showing a series of operations which the rechargeable battery state estimation device in accordance with Embodiment 4 of the present application performs.

Next, with reference to the flow diagrams of FIG. 5 to FIG. 12, explanation will be made about a series of operations which will be performed in the case where the rechargeable battery state estimation device 100 according to Embodiment 4 of the present application estimates a state of charge of the rechargeable battery 101. FIG. 12 is a flow diagram for showing a series of operations which the rechargeable battery state estimation device 100 according to Embodiment 1 of the present application performs.

It is to be noted that a series of operational treatments of Step S102 to Step S603, which are shown in FIG. 12, exhibit one period of operational treatments in the rechargeable battery state estimation device 100, and these operational treatments are repeated every sampling period ts.

Further, in Step S105, operational treatments are performed according to the flow diagram of FIG. 5, which is already explained. In Step S106, operational treatments will be performed according to the flow diagrams of FIG. 6 and FIG. 8, or FIG. 10, which are already explained.

Here, the number of each step in the respective flow diagrams of FIG. 5 to FIG. 12 corresponds to a component part of the rechargeable battery state estimation device 100. That is to say, as mentioned above, each component part of the rechargeable battery state estimation device 100 will perform a step, which exhibits the same number as the step in the respective flow diagrams of FIG. 5 to FIG. 12.

As shown in FIG. 12, the rechargeable battery state estimation device 100 performs a series of operational treatments of Step S102 to Step S603, every sampling period ts.

Further, in Step S105, the rechargeable battery state estimation device 100 performs a series of operational treatments of Step S201 to Step S204, which are shown in FIG. 5. Furthermore, in Step S106, the rechargeable battery state estimation device 100 performs a series of operational treatments of Step S301 to Step S304 which are shown in FIG. 6, or those of Step S401 to Step S404 which are shown in FIG. 8, or those of Step S501 to Step S505 which are shown in FIG. 10.

It is to be noted that, concerning each step of respective flow diagrams in FIG. 5 to FIG. 12, the order of steps which are performed in the rechargeable battery state estimation device 100 is not limited to the order of steps which are shown in each of the drawings. As long as the dependency relation of respective steps is not spoiled, the exchange in the execution sequence is permitted.

As mentioned above, according to Embodiment 4 of the present application, the estimated open circuit voltage OCVest is used to estimate an OCV estimation method parameter, and the OCV estimation method parameter is used in the OCV estimation method SOC estimation unit to calculate an SOCv. Accordingly, it is likely that the OCV estimation method parameter can be estimated more stably and/or more accurately, as compared with the case where the OCVest is not used. Thereby, other estimate values are also likely to be estimated more stably and/or more accurately.

Figure 13:
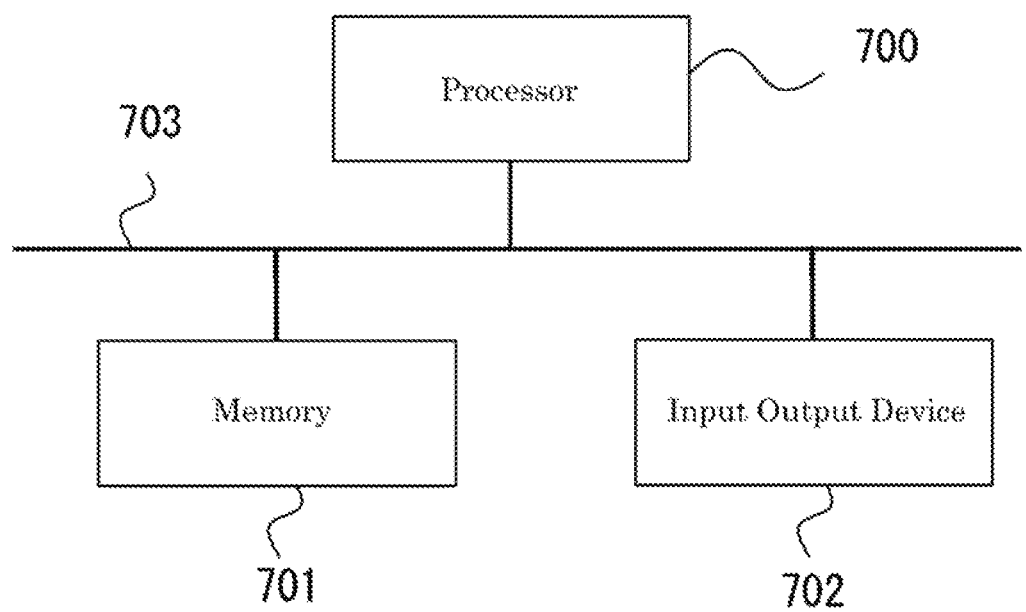
FIG. 13 is an illustration of the hardware constitution for realizing functional blocks in accordance with the Embodiments of the present application.

It is to be noted that each of the functional blocks, which are shown in FIG. 1, FIG. 2, FIG. 3, FIG. 7, FIG. 9, and FIG. 11, is realized by the hardware which is shown in FIG. 13. That is to say, a processor 700, a memory 701 which stores a program and data, and an Input Output device 702, such as a sensor, are connected with data buses 703, and the processing of data and the transmission of data are controlled by the processor 700.

Further, the present application can combine freely each of the embodiments within the scope of the disclosure, or each of the embodiments can be modified and eliminated, at proper times.

REFERENCE SIGNS LIST

100 Rechargeable Battery State Estimation Device; 101 Rechargeable Battery; 102 Current Detecting Unit; 103 Voltage Detecting Unit; 104 OCV Estimation Method SOC Estimation Unit; 105 Current Integration Method Parameter Estimation Unit; 106 Corrected SOC Estimation Unit; 201 Coefficient Vector Generation Part; 202 Integration Forgetting Filter; 203 Differential and Integration Forgetting Filter; 204 Recursive Estimation Part; 301 Estimation Part; 302 Subtraction Part; 303 Low Pass Filter; 304 Adder Part; 401 Estimation Unit; 402 Subtraction Part; 403 Low Pass Filter; 404 Gain Multiplication Part; 501 Estimation Unit; 502 Adder Part; 503 Subtraction Part; 504 Low Pass Filter; 505 Gain Multiplication Part; 601 Estimation Unit; 602 Estimating Method Parameter Estimation Unit; 603 Converting Unit

What is claimed is:

1. A rechargeable battery state estimation device which estimates a state of charge of a rechargeable battery as an estimated state of charge, the rechargeable battery state estimation device comprising:
a current detector which detects a charge-discharge current of the rechargeable battery as a detected current,
a voltage detector which detects a voltage between terminals of the rechargeable battery as a detected voltage,
a low pass filter which outputs a value which is eliminated of high frequency components, and
a processor configured to:
calculate an open circuit voltage (OCV) estimation state of charge of the rechargeable battery, based on the detected current of the rechargeable battery and the detected voltage between the terminals of the rechargeable battery,
estimate a current integration parameter including a capacity retention rate, based on the detected current of the rechargeable battery and the OCV estimation state of charge of the rechargeable battery, and
calculate an estimated state of charge of the rechargeable battery by:
calculating a current integration state of charge of the rechargeable battery, based on the detected current of the rechargeable battery and the current integration parameter of the rechargeable battery,
wherein the estimated state of charge of the rechargeable battery is based, at least in part, on (a) the current integration state of charge of the rechargeable battery and (b) the value output from the low pass filter that receives an input comprising a difference value between the OCV estimation state of charge of the rechargeable battery and one of the current integration state of charge of the rechargeable battery or the estimated state of charge of the rechargeable battery.

2. The rechargeable battery state estimation device as set forth in claim 1,
wherein the processor is configured to calculate a change in the state of charge of the rechargeable battery, based on the detected current and the current integration parameter, and wherein the processor is configured to correct an estimation error of the current integration parameter, and an estimation error for the current integration state of charge.

3. The rechargeable battery state estimation device as set forth in claim 2,
wherein the processor is configured to:
generate a first coefficient vector, based on the detected current,
obtain a second coefficient vector, based on the first coefficient vector,
obtain a reference signal, based on the OCV estimation state of charge, and
estimate the current integration parameter, based on the second coefficient vector and the reference signal.

4. The rechargeable battery state estimation device as set forth in claim 2,
wherein the processor is configured to:
compute the difference value by subtracting the current integration state of charge from the OCV estimation state of charge,
wherein the low pass filter receives as the input the difference value, and
wherein the estimated state of charge of the rechargeable battery is calculated by adding the current integration state of charge and the output value of the low pass filter.

5. The rechargeable battery state estimation device as set forth in claim 2,
wherein the processor is configured to:
compute the difference value by subtracting the estimated state of charge from the OCV estimation state of charge,
wherein the low pass filter receives as the input the difference value,
the rechargeable battery state estimation device further comprises a gain multiplication part which outputs a value which is computed by multiplying a positive real gain, based on the value which the low pass filter outputs; and
wherein the processor is configured to calculate the estimated state of charge, based on the detected current which the current detector outputs, the current integration parameter, and the value which the gain multiplication part outputs.

6. The rechargeable battery state estimation device as set forth in claim 2,
wherein the processor is configured to:
compute the difference value by subtracting the estimated state of charge from the OCV estimation state of charge, and
wherein the low pass filter receives as the input the difference value,
wherein the rechargeable battery state estimation device further comprises a gain multiplication part which outputs a value which is computed by multiplying a positive real gain, based on the value which the low pass filter outputs, and
wherein the estimated state of charge is calculated by adding the current integration state of charge and the value which the gain multiplication part outputs.

7. The rechargeable battery state estimation device as set forth in claim 2,
wherein the processor is configured to:
determine an estimated open circuit voltage from a corresponding relation between a state of charge of the rechargeable battery and an open circuit voltage, based on the estimated state of charge, and
estimate an OCV estimation parameter, based on the estimated open circuit voltage, the detected current and the detected voltage, and
wherein the calculation of the OCV estimation state of charge is based on the OCV estimation parameter, the detected current and the detected voltage.

8. The rechargeable battery state estimation device as set forth in claim 3,
wherein the processor is configured to:
compute the difference value by subtracting the current integration state of charge from the OCV estimation state of charge,
wherein the low pass filter receives as the input the difference value, and
wherein the estimated state of charge of the rechargeable battery is calculated by adding the current integration state of charge and an output value of the low pass filter.

9. The rechargeable battery state estimation device as set forth in claim 3,
wherein the processor is configured to:
compute the difference value by subtracting the estimated state of charge from the OCV estimation state of charge,
wherein the low pass filter receives as the input the difference value,
wherein the rechargeable battery state estimation device further comprises a gain multiplication part which outputs a value which is computed by multiplying a positive real gain, based on the value which the low pass filter outputs; and
wherein the processor is configured to calculate the estimated state of charge, based on the detected current which the current detector outputs, the current integration parameter, and the value which the gain multiplication part outputs.

10. The rechargeable battery state estimation device as set forth in claim 3,
wherein the processor is configured to:
compute the difference value by subtracting the estimated state of charge from the OCV estimation state of charge, and
wherein the low pass filter receives as the input the difference value,
wherein the rechargeable battery state estimation device further comprises a gain multiplication part which outputs a value which is computed by multiplying a positive real gain, based on the value which the low pass filter outputs, and
wherein the estimated state of charge is calculated by adding the current integration state of charge and the value which the gain multiplication part outputs.

11. The rechargeable battery state estimation device as set forth in claim 3,
wherein the processor is configured to:
determine an estimated open circuit voltage from a corresponding relation between a state of charge of the rechargeable battery and an open circuit voltage, based on the estimated state of charge, and
estimate an OCV estimation parameter, based on the estimated open circuit voltage, the detected current and the detected voltage, and
wherein the calculation of the OCV estimation state of charge is based on the OCV estimation parameter, the detected current and the detected voltage.

12. A rechargeable battery state estimation device which estimates a state of charge of a rechargeable battery as an estimated state of charge, the rechargeable battery state estimation device comprising:
a current detector which detects a charge-discharge current of the rechargeable battery as a detected current,
a voltage detector which detects a voltage between terminals of the rechargeable battery as a detected voltage, and
a processor configured to:
calculate an open circuit voltage (OCV) estimation state of charge of the rechargeable battery, based on the detected current of the rechargeable battery and the detected voltage between the terminals of the rechargeable battery,
estimate a current integration parameter including a capacity retention rate, based on the detected current of the rechargeable battery and the OCV estimation state of charge of the rechargeable battery,
calculate an estimated state of charge of the rechargeable battery by:
calculating a current integration state of charge of the rechargeable battery, based on the detected current of the rechargeable battery and the current integration parameter of the rechargeable battery,
calculate a change in the state of charge of the rechargeable battery, based on the detected current and the current integration parameter,
correct an estimation error of the current integration parameter, and an estimation error for the current integration state of charge,
generate a first coefficient vector, based on the detected current,
obtain a second coefficient vector, based on the first coefficient vector,
obtain a reference signal, based on the OCV estimation state of charge, and
estimate the current integration parameter, based on the second coefficient vector and the reference signal.

13. A rechargeable battery state estimation device which estimates a state of charge of a rechargeable battery as an estimated state of charge, the rechargeable battery state estimation device comprising:
a current detector which detects a charge-discharge current of the rechargeable battery as a detected current,
a voltage detector which detects a voltage between terminals of the rechargeable battery as a detected voltage,
a low pass filter which outputs a value which is eliminated of high frequency components, and
a processor configured to:
calculate an open circuit voltage (OCV) estimation state of charge of the rechargeable battery, based on the detected current of the rechargeable battery and the detected voltage between the terminals of the rechargeable battery,
estimate a current integration parameter including a capacity retention rate, based on the detected current of the rechargeable battery and the OCV estimation state of charge of the rechargeable battery,
calculate an estimated state of charge of the rechargeable battery by:
calculating a current integration state of charge of the rechargeable battery, based on the detected current of the rechargeable battery and the current integration parameter of the rechargeable battery,
calculate a change in the state of charge of the rechargeable battery, based on the detected current and the current integration parameter,
correct an estimation error of the current integration parameter, and an estimation error for the current integration state of charge, and
compute a difference value by subtracting the current integration state of charge from the OCV estimation state of charge,
wherein the low pass filter receives as the input the difference value, and
wherein the estimated state of charge of the rechargeable battery is calculated by adding the current integration state of charge and the output value of the low pass filter.

14. The rechargeable battery state estimation device as set forth in claim 12,
wherein the processor is configured to:
compute a difference value by subtracting the current integration state of charge from the OCV estimation state of charge, and
a low pass filter which outputs a value which is eliminated of high frequency components,
wherein the low pass filter receives as the input the difference value, and
wherein the estimated state of charge of the rechargeable battery is calculated by adding the current integration state of charge and an output value of the low pass filter.

15. The rechargeable battery state estimation device as set forth in claim 12,
wherein the processor is configured to:
compute a difference value by subtracting the estimated state of charge from the OCV estimation state of charge,
a low pass filter which outputs a value which is eliminated of high frequency components,
wherein the low pass filter receives as the input the difference value,
wherein the rechargeable battery state estimation device further comprises a gain multiplication part which outputs a value which is computed by multiplying a positive real gain, based on the value which the low pass filter outputs; and
wherein the processor is configured to calculate the estimated state of charge, based on the detected current which the current detector outputs, the current integration parameter, and the value which the gain multiplication part outputs.

16. The rechargeable battery state estimation device as set forth in claim 12,
wherein the processor is configured to:
compute a difference value by subtracting the estimated state of charge from the OCV estimation state of charge, and
a low pass filter which outputs a value which is eliminated of high frequency components,
wherein the low pass filter receives as the input the difference value,
wherein the rechargeable battery state estimation device further comprises a gain multiplication part which outputs a value which is computed by multiplying a positive real gain, based on the value which the low pass filter outputs, and
wherein the estimated state of charge is calculated by adding the current integration state of charge and the value which the gain multiplication part outputs.

17. The rechargeable battery state estimation device as set forth in claim 12,
  wherein the processor is configured to:
  determine an estimated open circuit voltage from a corresponding relation between a state of charge of the rechargeable battery and an open circuit voltage, based on the estimated state of charge, and
  estimate an OCV estimation parameter, based on the estimated open circuit voltage, the detected current and the detected voltage, and
  wherein the calculation of the OCV estimation state of charge is based on the OCV estimation parameter, the detected current and the detected voltage.

* * * * *